United States Patent
Uzoh et al.

(10) Patent No.: US 6,354,916 B1
(45) Date of Patent: Mar. 12, 2002

(54) MODIFIED PLATING SOLUTION FOR PLATING AND PLANARIZATION AND PROCESS UTILIZING SAME

(75) Inventors: Cyprian Uzoh, Milpitas; Bulent Basol, Manhattan Beach; Homayoun Talieh, San Jose, all of CA (US)

(73) Assignee: Nu Tool Inc., MIlpitas, CA (US)

(*) Notice: Subject to any disclaimer, the term of this patent is extended or adjusted under 35 U.S.C. 154(b) by 0 days.

(21) Appl. No.: 09/544,558

(22) Filed: Apr. 6, 2000

Related U.S. Application Data

(60) Provisional application No. 60/182,100, filed on Feb. 11, 2000.

(51) Int. Cl.$^7$ ............................................. B24B 1/00
(52) U.S. Cl. ........................ 451/41; 451/54; 451/63; 51/307; 438/692
(58) Field of Search ........................ 51/307; 216/88, 216/89; 438/691, 692, 693; 451/36, 41, 54, 63

(56) References Cited

U.S. PATENT DOCUMENTS

| | | |
|---|---|---|
| 3,328,273 A | 6/1967 | Creutz et al. |
| 4,430,173 A | 2/1984 | Boudot et al. |
| 4,948,474 A | 8/1990 | Miljkovic |
| 4,954,142 A | 9/1990 | Carr et al. |
| 4,975,159 A | 12/1990 | Dahms |
| 5,084,071 A | 1/1992 | Nenadic et al. |
| 5,256,565 A | 10/1993 | Bernhardt et al. |
| 5,354,490 A | 10/1994 | Ye et al. |
| 5,516,412 A | 5/1996 | Andricacos et al. |
| 5,681,215 A | 10/1997 | Sherwood et al. |
| 5,755,859 A | 5/1998 | Brusie et al. |
| 5,762,544 A | 6/1998 | Zuniga et al. |
| 5,770,095 A | 6/1998 | Sasaki et al. |
| 5,773,364 A | 6/1998 | Farkas et al. |
| 5,793,272 A | 8/1998 | Burghartz et al. |
| 5,795,215 A | 8/1998 | Guthrie et al. |
| 5,807,165 A | 9/1998 | Uzoh et al. |
| 5,840,629 A | 11/1998 | Carpio |
| 5,846,398 A | 12/1998 | Carpio |
| 5,858,813 A | 1/1999 | Scherber et al. |
| 5,866,031 A | 2/1999 | Carpio et al. |
| 5,884,990 A | 3/1999 | Burghartz et al. |
| 5,897,375 A | 4/1999 | Watts et al. |
| 5,911,619 A | 6/1999 | Uzoh et al. |
| 5,922,091 A | 7/1999 | Tsai et al. |
| 5,930,669 A | 7/1999 | Uzoh |
| 5,933,753 A | 8/1999 | Simon et al. |
| 5,954,997 A | 9/1999 | Kaufman et al. |
| 5,985,123 A | 11/1999 | Koon |

(List continued on next page.)

FOREIGN PATENT DOCUMENTS

| WO | 98/27585 | 6/1998 |
|---|---|---|
| WO | WO 00/26443 | 5/2000 |

OTHER PUBLICATIONS

James J. Kelly et al., "Leveling and Microstructural Effects of Additives for Copper Electrodeposition", Journal of the Electrochemical Society, 146 (7), 1999, pp. 2540–2545.

Joseph M. Steigerwald et al., "Chemical Mechanical Planarization of Microelectronic Materials", A Wiley–Interscience Publication, 1997 by John Wiley & Sons, Inc. pp. 212–222.

Wei William Lee et al., "Low–Dielectric–Constant Materials for ULSI Interlayer–Dielectric Applications", MRS Bulletin, Oct. 1997, pp. 19–23

(List continued on next page.)

Primary Examiner—Timothy V. Eley
(74) Attorney, Agent, or Firm—Crowell & Moring, LLP

(57) ABSTRACT

A modified plating solution that can be used to electroplate a high quality conductive material that can be effectively polished and planarized includes (1) a solvent, (2) an ionic species of the conductive material to be deposited, (3) at least one additive to improve electrical and structural properties, and (4) a modifying agent.

18 Claims, 3 Drawing Sheets

U.S. PATENT DOCUMENTS

| | | |
|---|---|---|
| 6,004,880 A | 12/1999 | Liu et al. |
| 6,010,964 A | 1/2000 | Glass |
| 6,027,631 A | 2/2000 | Broadbent |
| 6,063,306 A | 5/2000 | Kaufman et al. |
| 6,063,506 A | 5/2000 | Andricacos et al. |
| 6,066,030 A | 5/2000 | Uzoh |
| 6,071,388 A | 6/2000 | Uzoh |
| 6,074,544 A | 6/2000 | Reid et al. |
| 6,103,085 A | 8/2000 | Woo et al. |
| 6,103,096 A | 8/2000 | Datta et al. |
| 6,132,586 A | 10/2000 | Adams et al. |
| 6,132,587 A | 10/2000 | Jorne et al. |
| 6,136,163 A | 10/2000 | Cheung et al. |
| 6,156,661 A | 12/2000 | Small |
| 6,176,992 B1 | 1/2001 | Talieh |

OTHER PUBLICATIONS

Changming Jin et al., "Nanoporous Silica as an Ultralow–k Dielectric," MRS Bulletin, Oct. 1997, pp. 39–42.

Ken Monnig, "Why Copper and Low K?", Future Fab, Issue 5, May 3, 1999, pp. 1–7.

Alexander E. Braun, "ECP Technology Faces Chemical, Dielectric Hurdles", Cahners Semiconductor International, May 2, 2000, pp. 1–9.

Robert D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117–119.

US 6,354,916 B1

MODIFIED PLATING SOLUTION FOR PLATING AND PLANARIZATION AND PROCESS UTILIZING SAME

This application claims the priority of provisional application Ser. No. 60/182,100, filed Feb. 11, 2000, the entire disclosure of which is incorporated by reference herein.

Reference is hereby made to related application Ser. Nos. 09/472,523, filed Dec. 27, 1999, entitled WORK PIECE CARRIER HEAD FOR PLATING AND POLISHING, and 09/511,278, filed Feb. 23, 2000, entitled PAD DESIGNS AND STRUCTURES FOR A VERSATILE MATERIALS PROCESSING APPARATUS.

BACKGROUND AND SUMMARY OF INVENTION

Multi-level integrated circuit manufacturing requires many steps for metal and insulator film depositions followed by photoresist patterning and etching or other means of material removal. After photolithography and etching, the resulting wafer or substrate surface is non-planar and contains many features such as vias, lines, or channels. Often these features need to be filled with a specific material such as a metal, and then the wafer topographic surface needs to be planarized again, making it ready for the next level of processing.

Electrodeposition is a widely accepted technique for the deposition of a highly conductive material such as copper (Cu) into the features on the semiconductor wafer surface. Chemical mechanical polishing (CMP) is then employed to planarize the resulting surface.

In FIG. 1a, the large feature 1 and the small feature is are opened in the insulator layer 2, which is grown on a wafer. To fill these features with Cu, a barrier or adhesive layer 3 is first deposited over the whole wafer surface. Then a conductive Cu seed layer 4 is deposited over the barrier layer 3. Cu is electrodeposited over the whole surface by (1) making an electrical contact to the barrier layer 3 and/or the Cu seed layer 4; (2) placing the wafer in a standard Cu plating electrolyte; (3) placing an anode in the electrolyte; and (4) applying a negative voltage to the Cu seed layer with respect to the anode.

FIG. 1b shows the wafer after a short period of time which is adequate to deposit a Cu layer 5 with the thickness 5a. As shown in FIG. 1b, the Cu layer of nominal thickness 5a is adequate to fill in the small feature is since there is Cu film growth even on the conductive vertical walls of this feature. The large feature 1, however, is still not filled with Cu. To fill the large feature 1, Cu plating needs to proceed further, eventually yielding the structure depicted in FIG. 1c.

As can be seen in FIG. 1c, in this conventional approach, the electrodeposited Cu layer 5 forms a very large metal overburden 6 on the top surface of the insulator 2 and over the small feature 1s. The overburden 6a over the large feature 1 is very small. The surface of the structure in FIG. 1c is non-planar, and therefore needs to be polished and planarized. The overburden and portions of the barrier layer 3 are customarily removed by CMP, yielding the structure in FIG. 1d, which has electrically isolated Cu-filled features. Removal of the large and non-uniform metal overburden of FIG. 1c from the wafer surface is time consuming and expensive and is a major source of dishing defects 6b in large features.

It would be highly desirable if the plating process could yield a Cu film which was planar and had a uniform overburden as depicted in FIG. 1e. CMP of such a substrate would be much faster and more economical and defects would be minimized. If the plating process could yield Cu-filled features with no overburden as depicted in FIG. 1f, then there would not be the need for CMP of the Cu layer. Only the portions of the barrier layer 3 on the top surface of the insulator 2 would have to be removed.

Electrodeposition is commonly performed in specially formulated plating solutions or electrolytes containing ionic species of Cu as well as additives that control the texture, morphology, and the plating behavior of the Cu layer. A proper electrical contact is made to the seed layer on the wafer surface, typically along its circumference, and the wafer surface is dipped in the plating solution. A consumable Cu anode or an inert anode plate is also placed in the electrolyte. Deposition of Cu on the wafer surface can then be initiated when a cathodic potential is applied to the wafer surface with respect to the anode (i.e., when a negative voltage is applied to the wafer surface with respect to the anode plate).

There are many Cu plating solution formulations, some of which are commercially available. One such formulation uses Cu-sulfate ($CuSO_4$) as the copper source. James Kelly et al., *J. Electrochemical Society*, vol.146, p. 2540–45 (1999). A typical Cu-sulfate plating solution contains water; Cu-sulfate; sulfuric acid ($H_2SO_4$); a small amount of chloride ions; and a carrier, such as polyethylene glycols and/or polypropylene glycols. Some other chemicals are then added to this solution in small amounts to achieve certain properties of the Cu deposit. These additives can be classified under general categories such as levelers, brighteners, grain refiners, wetting agents, stress-reducing agents, and the like.

Commonly used levelers and brighteners are generally sulfur-containing compounds, such as derivatives of thiourea. Other levelers and brighteners are sulfonic acid derivatives, such as mercaptobenzene sulfonate. Other brighteners include 2,4-imidazolidine-diol, thiohydantoin, polyethers, polysulfides, and various dyes. There is a large volume of literature on the additives for Cu-plating solutions and their influence on the electroplated deposits. For example, U.S. Pat. No. 4,430,173 discloses an additive composition comprising the sodium salt of ω-sulfo-n-propyl N,N-diethyldithiocarbamate and crystal violet, which shows excellent stability. U.S. Pat. No. 4,948,474 discloses a brightener additive for a Cu plating solution. U.S. Pat. No. 4,975,159 discloses lists of alkoxylated lactams and sulfur-containing compounds which were found to be effective additives. U.S. Pat. No. 3,328,273 describes Cu plating baths containing organic sulfide compounds.

Although a large volume of literature exists on the subject of additives to Cu plating solutions, many of the additive formulations are kept as trade secrets by plating solution suppliers. Some examples of Cu plating additive solutions provided commercially are: (1) CUBATH M® system, marketed by Enthone-OMI; (2) COPPER GLEAM® system, marketed by LeaRonal; and (3) ULTRAFILL® Addition agent and Suppressor, marketed by Shipley. Commercially available Cu plating solutions with additives typically yield bright and soft Cu deposits that have low stress. Copper layers deposited out of these solutions cannot be polished and planarized with the same solution, simply because the plating solutions are formulated only for plating, not for polishing or planarization.

Copper layers are traditionally polished and planarized by CMP in a machine specifically designed for polishing. In this method, the plated wafer is loaded onto a carrier head. The wafer surface covered with the non-planar Cu deposit (FIG. 1c) is brought into contact with a polishing pad and a polishing slurry. The polishing slurry contains oxidizing chemicals and micron or sub-micron size abrasive particles. When the pad and the wafer surfaces are pressed together and moved with respect to each other, polishing by the abrasive particles is initiated and the metal overburden is removed from the surface. A different CMP slurry is used to remove the barrier layer from the top surface of the insulator. The desired planar surface with electrically isolated Cu-filled features shown in FIG. 1d is eventually obtained.

The chemistry of the polishing slurry and the type of the abrasive particles used in a given CMP process are selected according to the chemical nature of the material to be removed. Therefore, the compositions of the polishing slurries for copper, tungsten, tantalum, tantalum nitride, silicon dioxide, and like materials that are used in integrated circuit (IC) manufacturing may all be different. For example, U.S. Pat. Nos. 4,954,142; 5,084,071; 5,354,490; 5,770,095; 5,773,364; 5,840,629; 5,858,813; 5,897,375; 5,922,091; and 5,954,997, all disclose various CMP slurry compositions for effective polishing of Cu. Slurries typically contain a solvent and a selection of abrasive particles, such as silica or alumina particles, which are suspended in the solvent. Furthermore, complexing agents such as $NH_3$ and/or oxidizing agents such as $NO_3^-$ and $Fe(CN)_6^{3-}$ are also included in the formulations to increase the dissolution rate of the abraded material and thus increase the Cu removal rate.

A typical CMP slurry has a high pH so that a passivating surface layer can be formed and sustained on Cu surfaces in the features where the pad cannot make high pressure contact. The surface layer over the Cu film protects Cu in such areas from chemical attack by the solution. High regions of the Cu layer making high pressure physical contact with the pad get polished because the abrasive particles can remove the passivating surface layer. The abraded material is then carried away from the wafer surface and dissolved by the slurry.

As discussed in J. Steigerwald et al., *CMP of Microelectronic Materials*, sections 7.2.1. and 7.2.2., John Wiley & Sons Inc. (1997), Cu is not expected to form a protective surface film in acidic solutions with low pH. Therefore, if an acidic slurry is employed for CMP, Cu in all regions, including in the recessed features, would dissolve into the acidic slurry and planarization as depicted in FIG. 1e would not be possible. In *CMP of Microelectronic Materials*, it is suggested that when using an acidic CMP slurry, a non-native, film-forming agent such as benzotriazole (BTA) may be added to the slurry composition to avoid chemical etching of the deposit in the recessed areas. However, the data in *CMP of Microelectronic Materials* also demonstrates that BTA may reduce the polishing rate.

According to *CMP of Microelectronic Materials*, during CMP, a protective layer such as an oxide layer first forms on the Cu surface due to the chemical composition and the pH of the slurry. The surface film is then efficiently removed by the mechanical action of the abrasive particles. Removed material is moved away from the vicinity of the wafer surface to avoid re-deposition. This process continues until all the metal on high surfaces making contact with the pad is removed. CMP slurries that are commercially available are all designed for polishing and planarization only. There is no CMP slurry formulation that allows plating of materials.

Thus, the chemical compositions of metal plating solutions and metal polishing and planarization slurries are very different. Polishing cannot be realized in prior art metal plating solutions, and plating cannot be achieved with standard CMP slurries. This is not customarily a problem since metal plating and CMP processes are carried out in different machines at different times, and the plating solutions and CMP slurries used in these machines are only expected to achieve their respective single functions, namely, deposition and polishing. However, this conventional approach is time consuming and it raises the manufacturing cost for integrated circuits.

It is an object of the present invention to provide a metal deposition solution that allows for polishing and planarizing the plated metal layer using the same solution. Metal layers deposited and planarized using such a solution would yield desirable flat surfaces as shown in FIG. 1e in a short period of time and would even achieve the structure depicted in FIG. 1f using a single machine. The idea of simultaneous plating and polishing or plating/polishing of a conducting material on a workpiece or wafer surface was disclosed in co-pending U.S. patent application Ser. No. 09/201,929, filed on Dec. 1, 1998, the entirety of which is incorporated herein by reference.

U.S. Pat. No. 6,004,880 discloses a modified CMP apparatus and technique to achieve simultaneous plating and polishing on a semiconductor wafer. However, compositions of solutions that can be successfully employed in such processes have not been fully disclosed. U.S. Pat. No. 6,004,880 discloses a modified CMP apparatus and a simultaneous plating/polishing technique that would be achieved by modifying a CMP slurry. In other words, the approach is modifying a CMP process to also do plating. Therefore, an electrolyte composition that might contain Cu-sulfate was proposed to be mixed into a CMP slurry. Such an approach of mixing plating electrolytes into polishing slurries has several drawbacks.

Electronic applications of electroplated metals, such as electroplated Cu, require not only planar surfaces, but also excellent electrical and mechanical properties. Copper films used in such applications should have low resistivity values close to the bulk resistivity of Cu, which is about $1.6 \times 10^{-6}$ ohm-cm. Films should also have good electromigration properties; should adhere well to their substrates; and should have large grains. Although planarization is important in the overall process, a highly planar Cu layer with high resistivity would not be usable in many integrated circuit applications where high performance is desired, because the limiting speed at which the circuit can be run is a strong function of the resistivity of the metal used in its structure. Copper is typically plated out of acidic electrolytes because layers obtained from these electrolytes have low resistivity and other desirable characteristics. Plating Cu out of a solution with large amounts of undesirable impurities typically deteriorate the properties of the deposited films. Therefore, the quality of Cu layers obtained from slurry/electrolyte mixtures would in all probability be poor.

Mixing plating solutions into CMP slurries to modify the slurries for plating would be also problematic for other reasons. The chemistry of plating solutions and polishing slurries are highly incompatible. The Cu-sulfate plating solutions that are commonly used for Cu plating are highly acidic solutions with pH values well below 0.5, typically below 0.1. High pH values deteriorate the plated film properties, typically giving rise to rough and/or burned deposits, especially at high plating current densities that are necessary for fast processing. This deterioration is because limiting current density values decrease as the pH of the solution goes up. In contrast, CMP slurries that are commonly used have pH values well above 2, typically above 4.0. For example, CMP slurries CPS-01 and CPS-03 sold by 3M® corporation have pH values of around 7. HASTI-LITE® marketed by Rhodes has a pH of 7.25. MICROPLA-NAR CMP 9000® by EKC Technology Inc. has a pH value of 8.83. As discussed in *CMP of Microelectronic Materials*, high pH is desirable in CMP slurries because it allows the formation of a protective surface layer on Cu. In acidic electrolytes with low pH values, surface layers such as Cu-oxides cannot be stable. It is therefore expected that mixing low pH plating solutions with high pH polishing slurries would have detrimental effects on both plating and polishing processes.

Slurries are formulated to keep their abrasive particles dispersed or in suspension. According to the basic theory of dispersions, dispersion characteristics of small particles in a solution such as a CMP slurry is a strong function of the pH of the solution. Changing the pH of a perfect dispersion may totally destroy that dispersion and cause the particles to agglomerate and precipitate out. Plating is also sensitive to pH changes and is affected by the electrolyte composition. Even parts per million (ppm) levels of impurities/additives in plating solutions have profound effects on the properties of the plated materials. Electronic applications of conductive materials such as Cu require deposition of good quality films with low resistivity and large grain. Chemicals in the polishing slurry would affect the quality of the plating solution and therefore the quality of the Cu layer that might be plated with an electrolyte/slurry mixture.

U.S. Pat. No. 6,004,880 discloses the idea of adding a plating solution to modify a polishing slurry for the simultaneous plating/polishing of Cu on a wafer with surface feature widths of preferably 1 micron or less. In many circuit designs, however, there are surface features with widely varying widths. The small feature in FIG. 1a, for example, may have a width of only 0.1–0.5 microns, whereas the width of the large feature may be 10–100 microns. The depth of the features may be in the range of 1–5 microns. A slurry/electrolyte mixture could be introduced onto a wafer surface with only submicron size features, if the particle size in the slurry is selected such that the particles are larger than the feature size. This way, the large particles cannot get into the wells or channels defined by the small features. However, if there are both large and small features on the wafer, then use of such a slurry would result in lodging of some of the abrasive particles into the large vias and channels. The lodged particles would then interfere with Cu plating into the features; increase resistivity; destroy microstructure and device performance; and drastically reduce the process yield.

Even if the plating solution and the CMP slurry could be mixed and used for plating and polishing, their recycling would be uneconomical. Once used, these solutions would have to be discarded and the cost of processing would be high.

The present invention solves these problems by modifying a plating solution for plating and planarization, rather than modifying a polishing slurry for polishing and plating as disclosed in the prior art.

DETAILED DESCRIPTION OF THE DRAWINGS

The present invention modifies a plating solution for plating and planarization due to the following factors.

The quality of the deposited metal layer is of prime importance. In any process, one has to first assure this quality. Therefore, instead of taking a polishing solution and adapting it for plating, we took the route of taking a well-formulated plating solution and modifying it by adding a modifying agent to achieve in-situ planarization of the plated metal. The conditions to be satisfied by the modifying agent are: (1) addition of the modifying agents into the plating solution should not affect the grain size and resistivity of the plated layer in a detrimental way; (2) the modified plating solution containing modifying agents should yield a plated layer that can be efficiently polished and planarized; and (3) a user should be able to easily monitor the amount of the modifying agents in the solution and re-furbish and recycle the used solution in a closed loop system.

The present invention discloses plating solution compositions that are modified to allow the deposition of a high quality Cu layer, and at the same time allow either simultaneous or sequential polishing and planarization of the deposited layer. In this approach, commercially available, highly acidic Cu plating solutions are modified by the addition of oxidizers which do not appreciably affect the pH of the solution or the quality of the plated Cu layer. No slurry or particles are included in the formulation. Polishing and planarization is achieved using a fixed abrasive pad.

Figure 2:
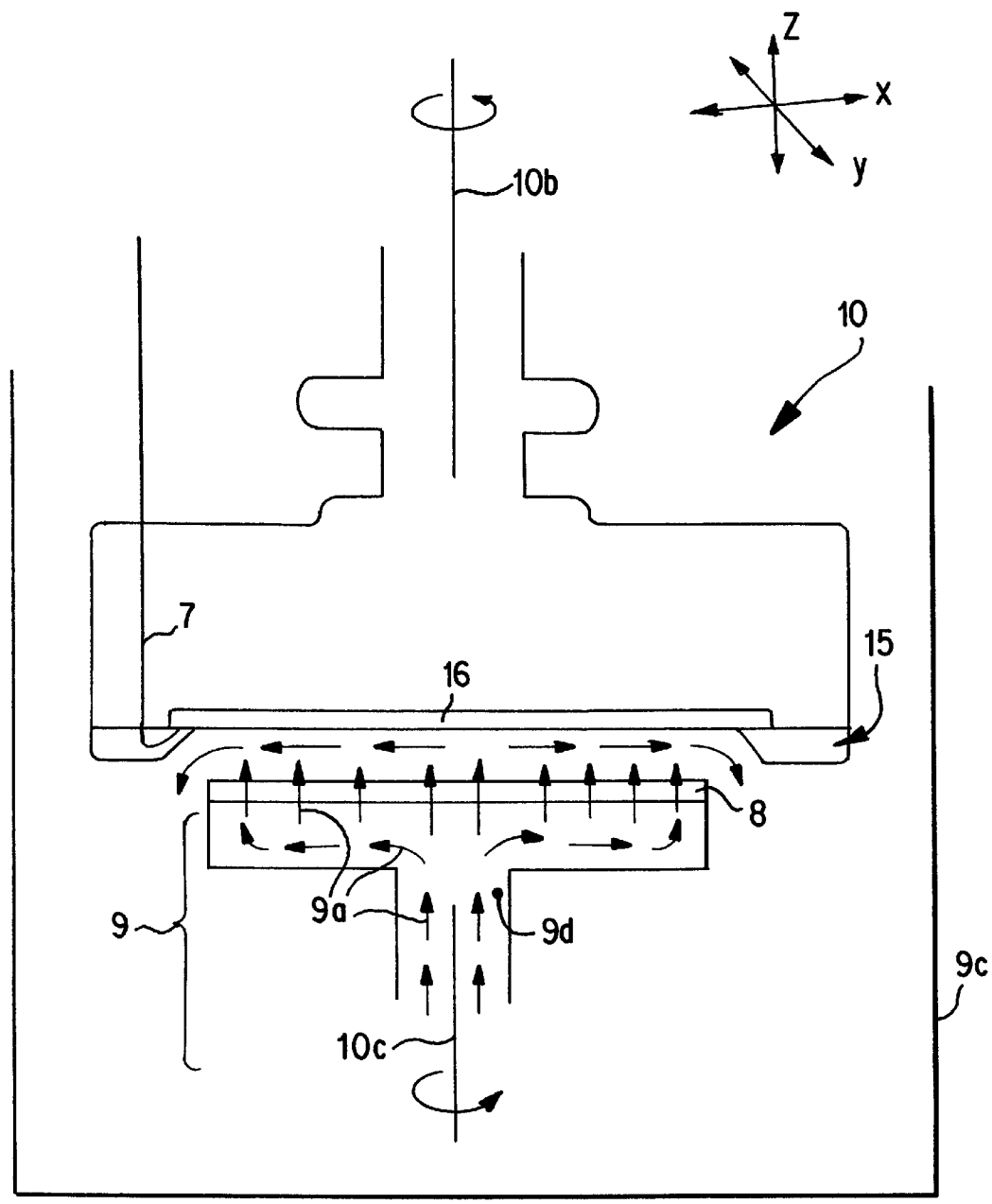
FIG. 2 schematically shows a plating/polishing apparatus that can be used according to the present invention.

A version of a plating/polishing apparatus that can be used to practice the present invention is schematically shown in FIG. 2. The carrier head 10 holds the wafer 16 and at the same time provides an electrical contact 7 to the seed layer on the wafer surface. The head can be rotated around a first axes 10b. It can also be moved in x, y, and z directions. A fixed abrasive polishing pad 8 is placed on an anode assembly 9 across from the wafer surface. Modified plating solution 9a of the present is supplied to the wafer surface, preferably through the openings in the anode assembly and the pad as shown by the arrows in the figure. The solution then flows over the edges of the pad into the chamber 9c to be re-circulated after cleaning/filtering/refurbishing. An electrical contact 9d is provided to the anode assembly 9. The anode assembly 9 can also be rotated around the axes 10c. The gap between the wafer surface and the pad is adjustable by moving the carrier head and/or the anode assembly in the z direction. When the wafer surface and the pad are touching, the pressure that is exerted on the two surfaces can also be adjusted.

Figure 1A:
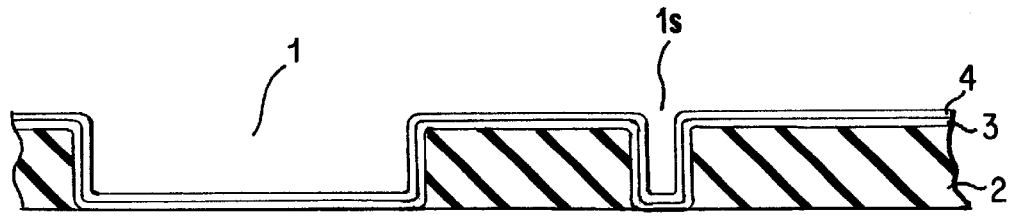
FIGS. 1a through 1d show an example of a prior art procedure for filling wafer surface features with electrode-posited Cu, and then polishing the wafer to obtain a structure with a planar surface and electrically isolated Cu plugs or wires.
Figure 1B:
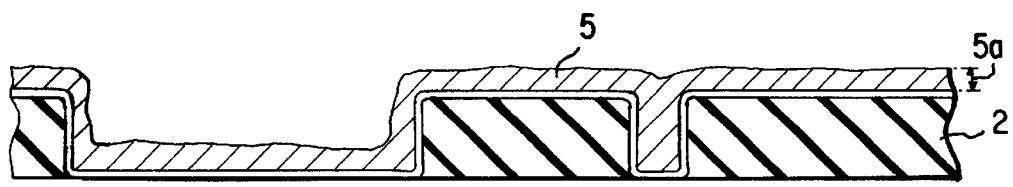
Figure 1C:
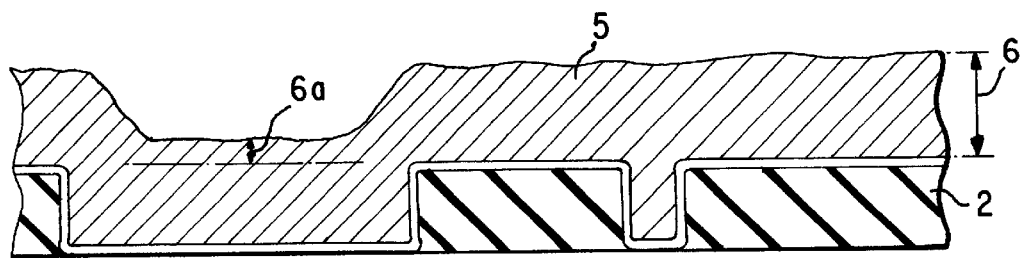
Figure 1D:

For plating, a potential is applied between the electrical contact 7 to the wafer 16 and the electrical contact 9d to the anode assembly 9, making the wafer surface more negative than the anode assembly. Under applied potential, a high quality layer of metal plates out of the modified plating solution onto the wafer surface. By adjusting the gap between the pad and the wafer surface and/or by adjusting the pressure with which the pad and the wafer surface touch each other, one can achieve just plating, or plating and polishing. For example, if there is a gap between the wafer surface and the pad, plating is expected to take place over the whole wafer surface as illustrated in FIG. 1c. In this case, a metal film is obtained that can be polished in a CMP process in a separate CMP machine. It should be noted that Cu layers plated out of the modified plating solutions of the present invention were found to be polished more efficiently compared to Cu layers obtained from standard plating solutions and therefore are advantageous.

Figure 1E:
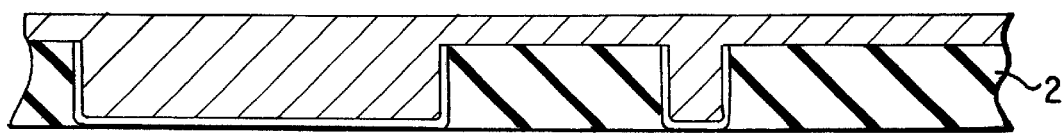
FIG. 1e shows a metal deposit with uniform metal overburden across the surface of the substrate according to the present invention.
Figure 1F:
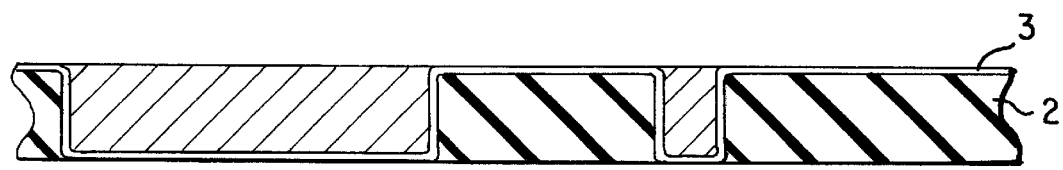
FIG. 1f shows plating just in the holes according to the present invention.

If the pad and the wafer surface in FIG. 2 were touching at low pressures, then plating can freely take place in the holes in the substrate where there is no physical contact between the wafer surface and the abrasive pad, but the plating rate will be reduced on the top surfaces where there is physical contact between the pad and the surface. The result is a metal deposit with uniform metal overburden across the surface of the substrate as shown in FIG. 1e. This is in contrast to the conventional deposition method of FIG. 1c where there is significant variation in metal overburden across the substrate. If the pressure with which the substrate and the pad surfaces touch each other is further increased, it is possible to obtain plating just in the holes as shown in FIG. 1f. In this case, the increased polishing action on the high points of the substrate surface does not allow accumulation of metal layer on these regions.

It should be understood that the modified plating solution of the present invention may be used in apparatus with various other designs, including designs for just plating and designs for plating and polishing. For plating a metallic layer that can be later polished more effectively, many kinds of plating apparatus can employ the solution of this invention by simply replacing the standard plating solution with the modified solution of the present invention. For plating/polishing applications, any apparatus that can apply a voltage difference between the wafer surface and an electrode touching the modified plating solution of the present invention, while pressing a fixed abrasive pad against the wafer surface and moving the pad and the wafer surface with respect to each other, can be employed.

It is not fully understood how the addition of small amounts of oxidizers in the highly acidic Cu plating solutions allows the use of these solutions for plating and planarization. However, it is possible that the surface layer formed on the Cu deposit by the presence of oxidizers does not interfere with the plating of a good quality Cu layer, but at the same time can be efficiently removed from the sections of the film where the pad contacts it with some pressure.

The amount of oxidizer added to the plating solution may be less than 500 ppm, however preferably it should be more. Oxidizer concentration may typically be in the 0.01 wt. % to 10 wt. % range. Both inorganic and organic oxidizers, either pure or mixed, or their mixtures can be used as modifying agents, but organic oxidizers are preferred. Among the many organic oxidizers known to those in the field of chemistry, the preferred modifying agents are organic nitrites and nitrates. Although butyl nitrite is an organic oxidizer that was used as the modifying agent in the following examples to demonstrate the present invention, other modifying agents can also be used to obtain the same result. For example, other organic oxidizers, preferably organic nitrites can be used. Organic nitrites include, but are not limited to, alkyl nitrites, aromatic nitrites, and polyaromatic nitrites. Alkyl nitrites include, but are not limited to, primary, secondary and tertiary compounds of methyl, ethyl, propyl, butyl, and amyl nitrites. Additionally, nitrates of the above compounds may also be used.

Although the examples use Cu deposits, it should be understood that many other conductive materials such as Cu alloys, W, Au, Ni, Pt, Pd, Ag, Co, Sn, Pb and their alloys can be used in the practice of the present invention.

EXAMPLES

Example 1

STANDARD PLATING SOLUTION

A Cu-sulfate based Cu plating solution was prepared as follows:

70 grams per liter of $CuSO_4 + 5H_2O$, 150 grams per liter of concentrated $H_2SO_4$, and 70 ppm per liter of $Cl^-$ ions were mixed in enough water to make 10 liters of solution. Twenty-five ml of Ultrafill S2001®, 1.0 ml of Ultrafill A2001® from Shipley were then added to obtain a standard good quality plating electrolyte. 100 micron range. The pad was a fixed abrasive pad supplied by 3M® company. The diameter of the pad was 180 mm and the anode assembly was oscillated in the horizontal direction so that plating could be achieved on all areas on the larger wafer surface. During plating, the distance between the pad and the wafer surface was kept at around 0.1 cm. The plating current was 2 Amp and the plating solution flow was 5 liters/minute. The wafer was rotated at 75 rpm and the anode assembly with the pad was rotated at 100 rpm in the same direction. Several wafers were plated for times ranging from 90 seconds to 4 minutes. Resulting Cu deposits were similar to the ones depicted in FIGS. 1b and 1c depending on the depth of the surface features and the plating period. The Cu deposits after aging at room temperature for one day had a resistivity of below $2 \times 10^{-6}$ ohm-cm, indicating good material quality.

Example 2

POLISHING AND PLANARIZATION USING STANDARD PLATING SOLUTION

The plating experiment of Example 1 was repeated, except this time, after an initial period of 30 seconds, the pad was pushed against the wafer surface at a pressure of 1 psi for plating as well as polishing and planarization. The resulting Cu deposit had a rough surface with deep scratches apparently caused by the abrasive pad. There were also Cu particles smeared all over the surface of the wafer. Very little amount of material removal was achieved because material removed from one region of the surface by the action of the abrasive pad was probably deposited back onto the surface at another region in the form of smeared particles, which were welded or bonded to the substrate surface. The substrate defect level was extremely high and feature filling was poor.

Example 3

MODIFIED PLATING SOLUTION ACCORDING TO THE PRESENT INVENTION

Five ml per liter of butyl-nitrite was added as a modifying agent to the electrolyte of Example 1 and the plating and polishing experiment of Example 2 was repeated using this modified plating solution. The resulting Cu deposit was highly planar and was similar to the structure shown in FIG. 1e. Copper layer resistivity was still below $2 \times 10^{-6}$ ohm-cm, demonstrating the ability of the modified electrolyte to yield high quality Cu deposits. Copper film was planar with uniform overburden over the sub-micron size features as well as the large features.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for depositing and planarizing a conductive material on a surface of a substrate, comprising:

depositing the conductive material via electrodeposition on the surface of the substrate using a solution comprising an ionic species of the conductive material, an oxidizer, and a solvent; and planarizing the conductive material using the solution.

2. The process of claim 1, wherein the conductive material is deposited and planarized simultaneously and wherein the planarizing step further comprises:

causing the solution to flow from a planarizing pad to the surface of the substrate; and contacting the planarizing pad with the surface of the substrate.

3. The process of claim 2, wherein the planarizing pad is a fixed abrasive pad.

4. The process of claim 2, wherein the planarizing pad contacts the surface of the substrate at low pressure, and the conductive material is deposited and planarized on the surface of the substrate with a uniform overburden.

5. The process of claim 2, wherein the planarizing pad contacts the surface of the substrate at an increased pressure, and the conductive material is minimally deposited and planarized on the surface of the substrate.

6. The process of claim 1, and further comprising recycling said solution, wherein the solution is recyclable in a closed loop.

7. A process for depositing and planarizing an conductive material on a substrate, comprising:

depositing the conductive material via electrodeposition only in available features on the substrate, but not on a surface of the substrate, using a solution comprising an ionic species of the conductive material, an oxidizer, and a solvent; and planarizing the conductive material using the solution.

8. A process of depositing and simultaneously polishing and planarizing a high quality conductive layer on a surface of a substrate, comprising:

loading a substrate on a holder;

introducing a plating solution comprising an oxidizer on an abrasive polishing pad;

pressing the abrasive polishing pad against the surface of said substrate;

contacting the plating solution with the surface of the substrate and an electrode;

applying a potential difference between the surface of the substrate and the electrode, thereby depositing a conductive layer out of the plating solution on the surface of the substrate; and moving the abrasive pad and the surface of the substrate with respect to each other, thereby simultaneously polishing and planarizing the conductive layer on said substrate.

9. A process according to claim 8, wherein the conductive layer comprises copper.

10. A process according to claim 8, wherein the plating solution comprises an acidic copper plating solution.

11. A process according to claim 10, wherein the acidic copper plating solution has a pH value of less than 4.

12. A process according to claim 8, wherein said oxidizer is selected from the group consisting of an inorganic oxidizer, an organic oxidizer, and mixtures thereof.

13. A process according to claim 12, wherein the oxidizer is an organic nitrite.

14. A process according to claim 13, wherein the nitrite is selected from the group consisting of alkyl nitrites, aromatic nitrites, and polyaromatic nitrites.

15. A process according to claim 14, wherein the organic nitrite is an alkyl nitrite.

16. A process according to claim 15, wherein the alkyl nitrite is butyl nitrite.

17. A process according to claim 8, wherein the oxidizer is an organic nitrate.

18. A process according to claim 8, wherein the substrate comprises surface features, and wherein at least one of the surface features has a width of about 0.1–100 microns.

* * * * *